United States Patent
Jo

(10) Patent No.: US 9,749,560 B2
(45) Date of Patent: Aug. 29, 2017

(54) IMAGE SENSOR

(71) Applicant: SK hynix Inc., Gyeonggi-do (KR)

(72) Inventor: Min-Hee Jo, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 85 days.

(21) Appl. No.: 15/008,280

(22) Filed: Jan. 27, 2016

(65) Prior Publication Data

US 2017/0142357 A1   May 18, 2017

(30) Foreign Application Priority Data

Nov. 18, 2015 (KR) .................. 10-2015-0161586

(51) Int. Cl.
*H04N 5/374* (2011.01)
*H04N 5/363* (2011.01)
*H01L 27/146* (2006.01)

(52) U.S. Cl.
CPC ......... *H04N 5/363* (2013.01); *H01L 27/1461* (2013.01); *H01L 27/14612* (2013.01); *H01L 27/14643* (2013.01); *H04N 5/374* (2013.01)

(58) Field of Classification Search
CPC .............................. H04N 5/374; H04N 5/3745
USPC .................................................. 348/294, 302
See application file for complete search history.

(56) References Cited

U.S. PATENT DOCUMENTS

| | | | |
|---|---|---|---|
| 2007/0090423 A1* | 4/2007 | Park | H01L 27/14603 257/292 |
| 2015/0002717 A1 | 1/2015 | Kudoh | |
| 2015/0124139 A1* | 5/2015 | Ishiwata | H04N 5/37452 348/308 |

FOREIGN PATENT DOCUMENTS

KR   100818724   4/2008

* cited by examiner

*Primary Examiner* — Anthony J Daniels
(74) *Attorney, Agent, or Firm* — IP & T Group LLP

(57) ABSTRACT

An image sensor may include a pixel array in which a plurality of pixel units are arranged in a matrix structure. Each of the pixel units may include a light receiver suitable for generating photocharge in response to incident light, a floating diffusion node electrically coupled to an end of the light receiver, and a reset transistor electrically isolated from the floating diffusion node, wherein a floating diffusion node of a first pixel unit among the plurality of pixel units is electrically coupled to a reset transistor of a second pixel unit adjacent to the first pixel unit among the plurality of pixel units.

21 Claims, 18 Drawing Sheets

IMAGE SENSOR

CROSS-REFERENCE TO RELATED APPLICATIONS

The present application claims priority of Korean Patent Application No. 10-2015-0161586, filed on Nov. 18, 2015, which is herein incorporated by reference in its entirety.

BACKGROUND

Exemplary embodiments of the present invention relate to a semiconductor device and more particularly, to an image sensor.

Image sensors convert optical images into electrical signals. With the development of the computer and communication industries, there has been increased demand for image sensors having improved performance in various applications, such as digital cameras, camcorders, smart phones, game machines, security cameras, medical micro cameras, robots and the like.

SUMMARY

Various embodiments are directed to an image sensor with improved performance.

In an embodiment, an image sensor may include a pixel array in which a plurality of pixel units are arranged in a matrix structure. Each of the pixel units may include a light receiver suitable for generating photocharge in response to incident light, a floating diffusion node electrically coupled to an end of the light receiver, and a reset transistor electrically isolated from the floating diffusion node, wherein a floating diffusion node of a first pixel unit among the plurality of pixel units is electrically coupled to a reset transistor of a second pixel unit adjacent to the first pixel unit among the plurality of pixel units.

The first pixel unit may be arranged at the same column but a different row as/from the second pixel unit. In the pixel array, when the first pixel unit is arranged at an Nth row and an Mth column n the pixel array, the second pixel unit may be arranged at an (N+1)th row and the Mth column or at an (N−1)th row and the Mth column, where N and M are natural numbers excluding zero. The first pixel unit may be arranged at the same row but a different column as/from the second pixel unit. In the pixel array, when the first pixel unit is arranged at an Nth row and an Mth column in the pixel array, the second pixel unit may be arranged at the Nth row and an (M+1)th column or at the Nth row and an (M−1)th column, where N and M are natural numbers excluding zero. The first pixel unit may be arranged at a different row and a different column from the second pixel unit. The first pixel unit may be arranged in a diagonal direction based on the second pixel unit. In the pixel array, when the first pixel unit is arranged at an Nth row and an Mth column in the pixel array, the second pixel unit may be arranged at one of (N−1)th and (N+1)th rows and one of (M−1)th and (M+1)th columns, where N and M are natural numbers excluding zero. The light receiver may include one or more light receiving units. The light receiving unit may include a photoelectric conversion element suitable for generating the photocharge in response to the incident light, and a transfer transistor suitable for coupling the photoelectric conversion element and the floating diffusion node.

In an embodiment, an image sensor may include a pixel array in which a plurality of pixel units are arranged in a matrix structure. Each of the pixel units may include a light receiver suitable for generating photocharge in response to incident light, a floating diffusion node electrically coupled to an end of the light receiver, a reset transistor electrically isolated from the floating diffusion node, and a source follower transistor having a gate electrically coupled to the floating diffusion node.

A floating diffusion node of a first pixel unit among the plurality of pixel units may be electrically coupled to a reset transistor of a second pixel unit adjacent to the first pixel unit among the plurality of pixel units. The first pixel unit may be arranged at the same column but a different row as/from the second pixel unit. The first pixel unit may be arranged at the same row but a different column as/from the second pixel unit. The first pixel unit may be arranged at a different row and a different column from the second pixel unit. The first pixel unit may be arranged in a diagonal direction based on the second pixel unit. In the pixel array, when the first pixel unit is arranged at an Nth row and an Mth column n the pixel array, the second pixel unit may be arranged at an (N+1)th row and the Mth column or at an (N−1)th row and the Mth column, where N and M are natural numbers excluding zero. In the pixel array, when the first pixel unit is arranged at an Nth row and an Mth column in the pixel array, the second pixel unit may be arranged at the Nth row and an (M+1)th column or at the Nth row and an (M−1)th column, where N and M are natural numbers excluding zero. In the pixel array, when the first pixel unit is arranged at an Nth row and an Mth column in the pixel array, the second pixel unit may be arranged at one of (N−1)th and (N+1)th rows and one of (M−1)th and (M+1)th columns, where N and M are natural numbers excluding zero.

In an embodiment, an image sensor may include a pixel array in which a plurality of pixel units are arranged in a matrix structure. Each of the pixel units may include a light receiver suitable for generating photocharge in response to incident light, and an output unit electrically coupled to the light receiver through a floating diffusion node and suitable for outputting an image signal in response to the photocharge, wherein the floating diffusion node of the pixel unit is reset by an adjacent pixel unit among the pixel units.

The output unit of each of the pixel units may further comprise a reset transistor electrically isolated from the floating diffusion node of the pixel unit and suitable for resetting a floating diffusion node of an adjacent pixel unit among the pixel unit.

DETAILED DESCRIPTION

Figure 1:
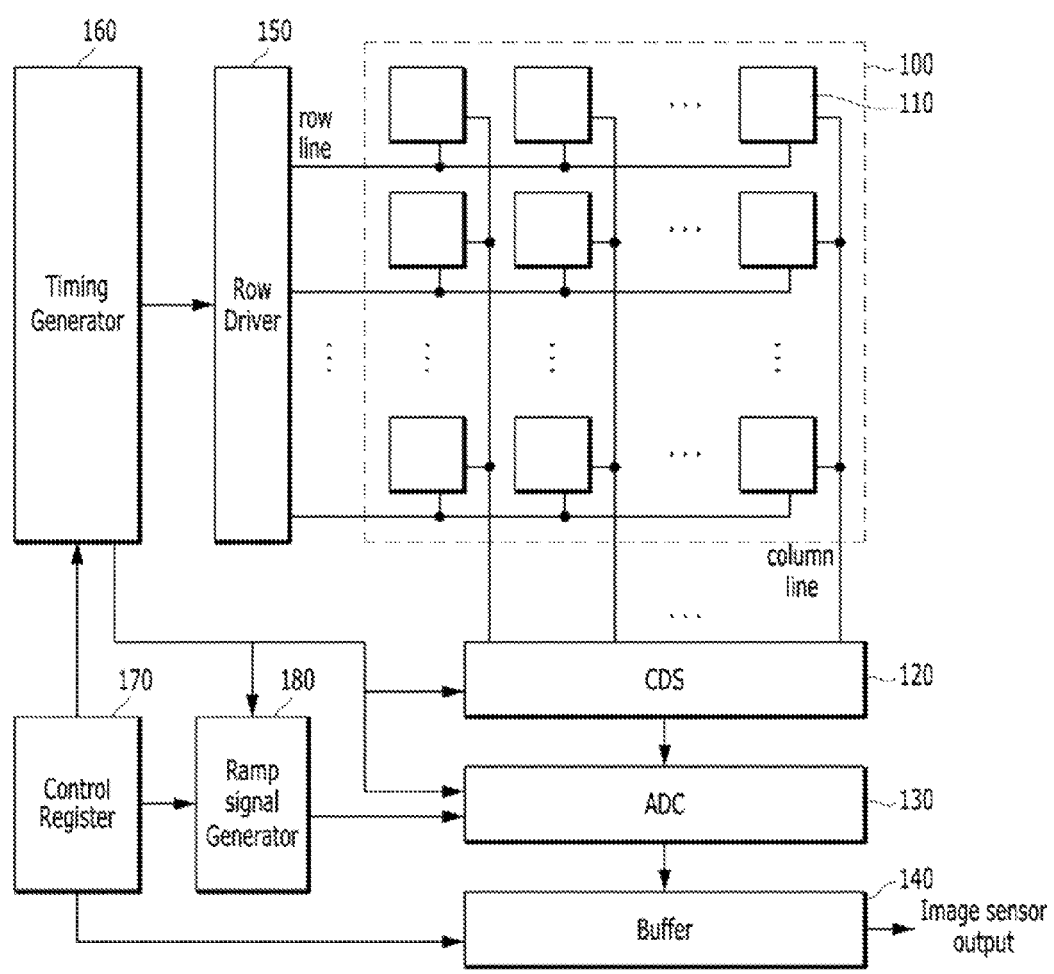
FIG. 1 is a block diagram schematically illustrating an image sensor.

Various embodiments of the present invention and comparative examples of the prior art will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the scope of the present invention to those skilled in the art. The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

An image sensor may convert an optical image into an electrical signal. Examples of image sensors may include a CCD (Charge Coupled Device) and a CIS (CMOS Image Sensor). A CIS may include a simple driving system and may be less expensive to manufacture because it may be manufactured using CMOS (Complementary Metal oxide Semiconductor) process technology. A CIS may include a pixel array including a plurality of pixel units arranged in a matrix structure, wherein each of the pixel units may include a light receiver for generating a photocharge in response to the incident light. A CIS may further include an output unit for outputting an image signal in response to the generated photocharge. The output unit may include a plurality of pixel transistors. The output unit may have a variety of architectures.

The following embodiments of the present invention provide an image sensor with improved performance, which may prevent characteristic degradation of a plurality of pixel units therein. Specifically, the image sensor may prevent the signal-to-noise ratio (SNR) of its image signal from increasing due to interference between pixel transistors in each of the pixel units.

FIG. 1 is a block diagram schematically illustrating an image sensor.

As illustrated in FIG. 1, the image sensor may include a pixel array 100, a correlated double sampling unit (CDS) 120, an analog-to-digital converter (ADC) 130, a buffer 140, a row driver 150, a timing generator 160, a control register 170, and a ramp signal generator 180. The pixel array 100 may include a plurality of pixel units 110 (or pixels) arranged in a matrix structure.

The timing generator 160 may generate control signals for controlling the operations of the row driver unit 150, the correlated double sampling unit 120, the analog-to-digital converter 130, and the ramp signal generator 180. The control register 170 may generate control signals for controlling the operations of the ramp signal generator 180, the timing generator 160, and the buffer 140.

The row driver 150 drives the pixel array 100 on the basis of row lines. For example, the row driver 150 may generate a selection signal capable of selecting one row line from a plurality of row lines. One or more pixel units 110 may be coupled to each of the row lines. One row line is coupled to each of the pixel units 110.

Each of the pixel units 110 may detect incident light and output an image reset signal and an image signal to the correlated double sampling unit 120 through a column line. The correlated double sampling unit 120 samples each of the received image and image reset signals. One or more pixel units 110 may be coupled to each of a plurality of column lines. One column line may be coupled to each of the pixel units 110. The analog-to-digital converter 130 may compare a ramp signal outputted from the ramp signal generator 180 with a sampling signal outputted from the correlated double sampling unit 120. The analog-to-digital converter 130 may output a comparison signal to the buffer 140. The analog-to-digital converter 130 may count a level transition time of the comparison signal based on a clock signal provided from the timing generator 160, and may output a count value to the buffer 140. The ramp signal generator 180 may operate under the control of the timing generator 160.

The buffer 140 may store a plurality of count values outputted, as digital signals, from the analog-to-digital converter 130. The buffer 140 may sense-amplify and output the count values. The buffer 140 may include a memory (not illustrated) for storing the count values that are associated with signals outputted from the pixel units 110. The buffer 140 may further include a sense amplifier (not illustrated) for sensing and amplifying the count values outputted from the memory.

Hereafter, an image sensor according to a comparative example is described with reference to FIGS. 2A to 3B, in order to demonstrate the increase of SNR which may be caused by interference between pixel transistors in each of the pixel units 110.

Figure 2A:
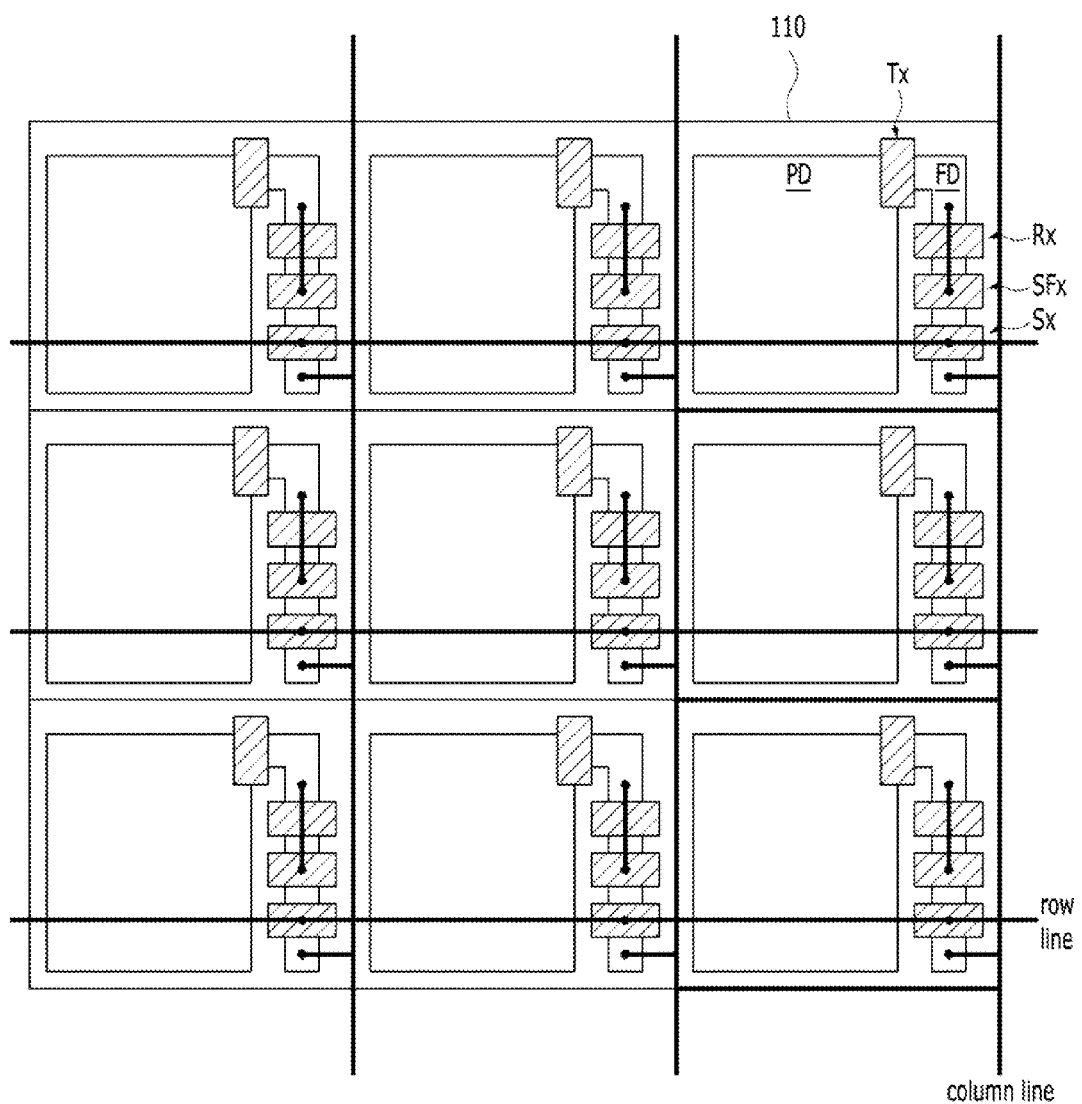
FIGS. 2A and 2B are diagrams illustrating a part of a pixel array of an image sensor, according to a first comparative example.
Figure 2B:
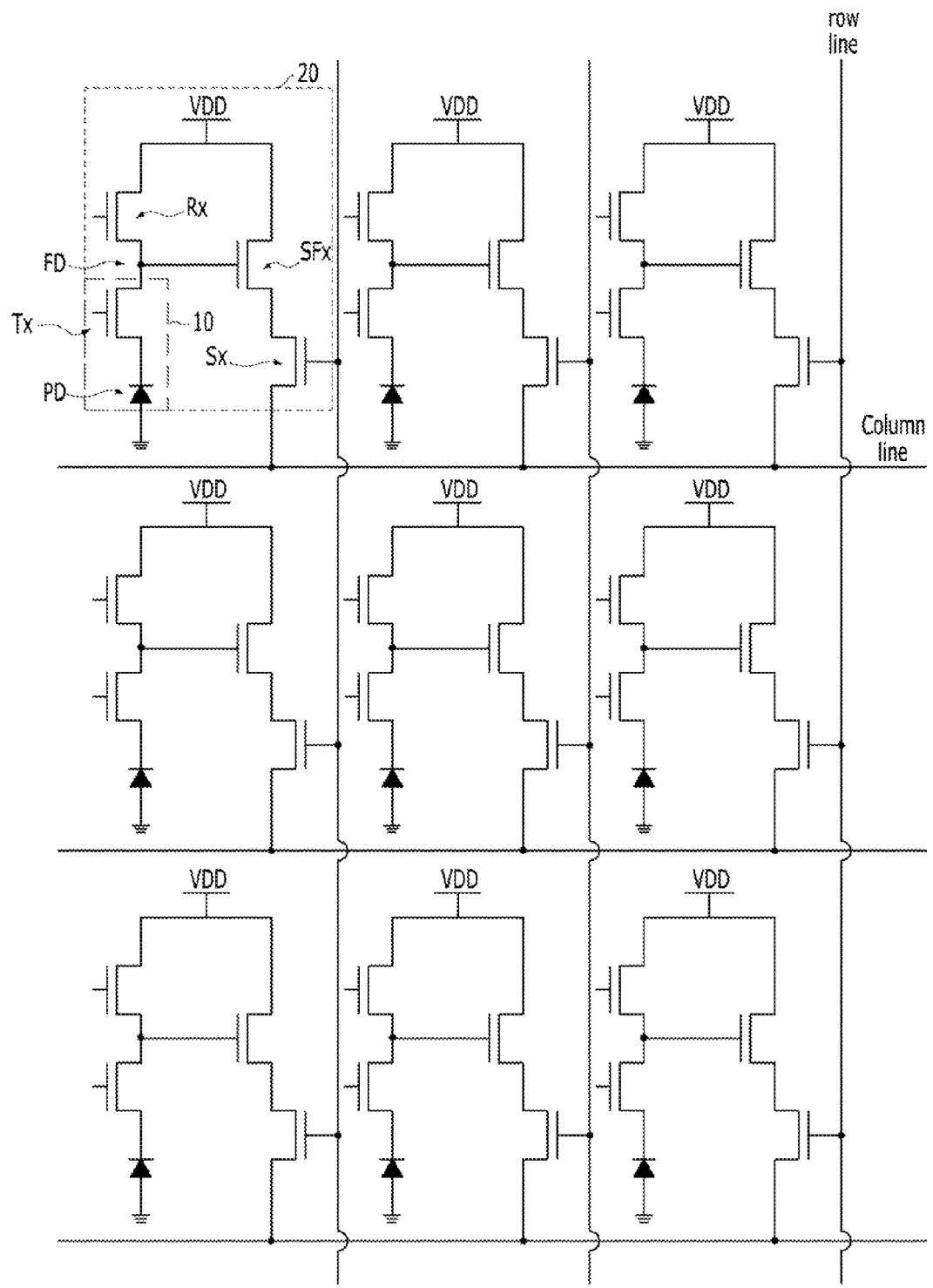
Figure 3A:
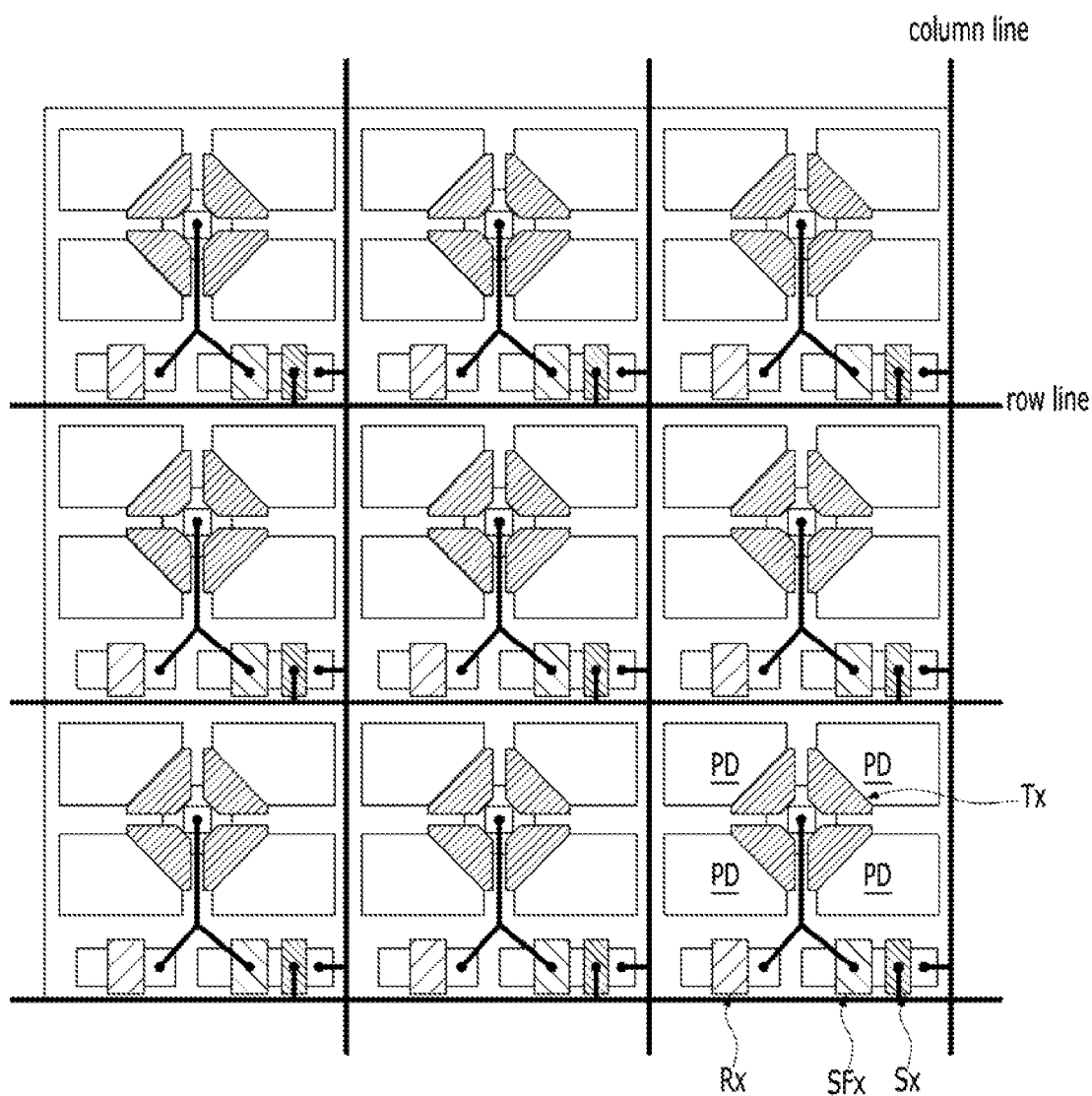
FIGS. 3A and 3B are diagrams illustrating a part of a pixel array of an image sensor, according to a second comparative example.
Figure 3B:
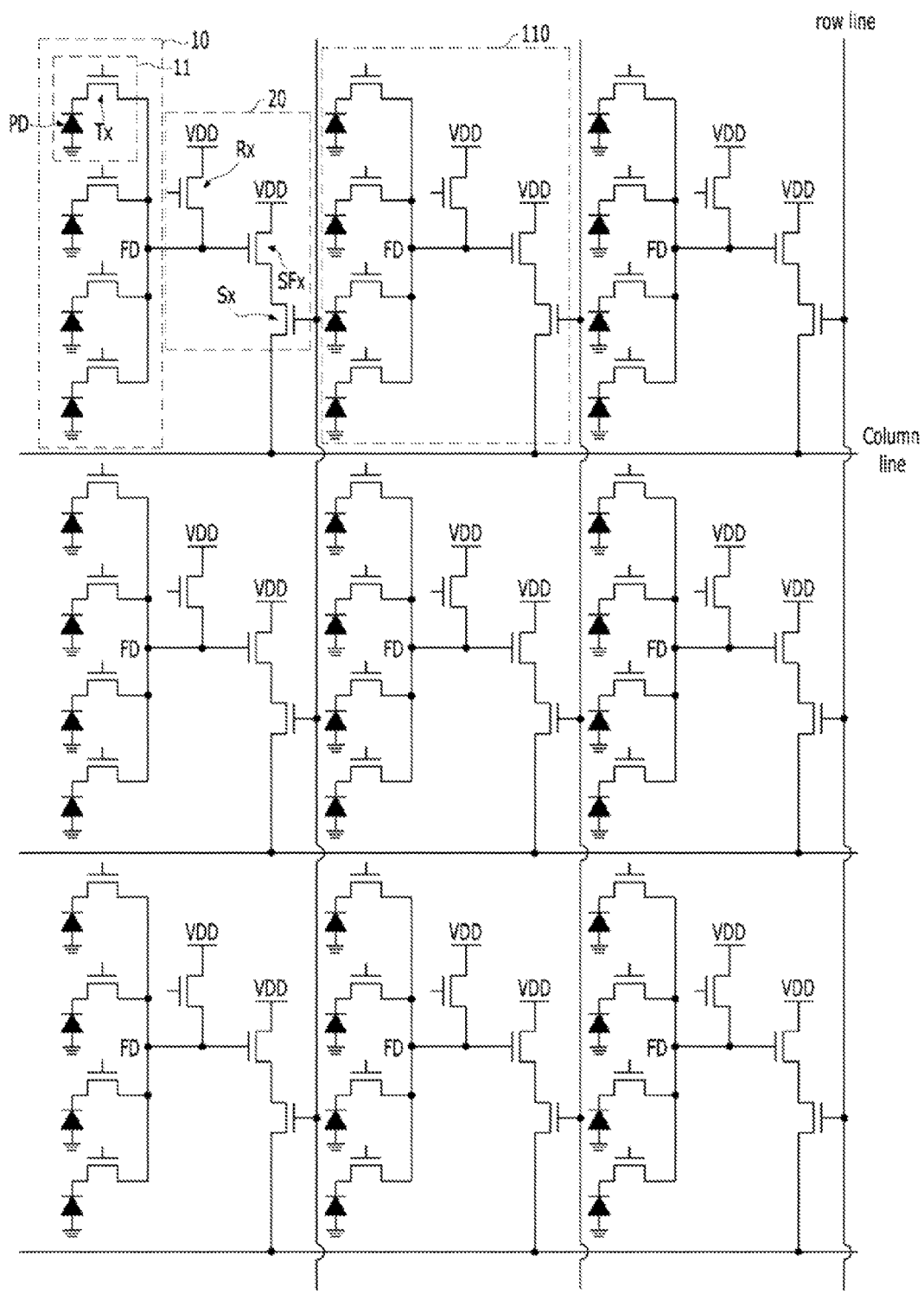

Specifically, FIGS. 2A and 2B illustrate a part of a pixel array of an image sensor according to a first comparative example while FIGS. 3A and 3B illustrate a part of a pixel array of an image sensor according to a second comparative example. FIGS. 2A and 3A are plan views, while FIGS. 2B and 3B are equivalent circuit diagrams.

In the image sensor according to the first comparative example, each of a plurality of pixel units 110 may include a light receiver 10 and an output unit 20. The light receiver 10 may generate a photocharge in response to incident light, and the output unit 20 may output an image signal in response to the photocharge generated by the light receiver 10. The light receiver 10 and the output unit 20 may be electrically coupled through a floating diffusion node FD.

The output unit 20 may output the image signal to a column line in response to a selection signal applied through a row line.

The light receiver 10 in each of the pixel units 110 may include a photoelectric conversion element PD and a transfer transistor Tx. The photoelectric conversion element PD may include a photodiode. The output unit 20 in each of the pixel units 110 may include a reset transistor Rx, a source follower transistor SFx, and a selection transistor Sx. The transfer transistor Tx and the reset transistor Rx may be electrically coupled to the floating diffusion node FD, and the gate of the source follower transistor SFx may also be electrically coupled to the floating diffusion node FD.

In the image sensor according to the first comparative example, each of the pixel units 110 may have a structure in which the gate of the transfer transistor Tx (hereafter, referred to as a transfer gate) and the gate of the reset transistor Rx (hereafter, referred to as a reset gate) are arranged adjacent to each other. Thus, interference or coupling may occur between the transfer and the reset gates in operation which may degrade the operation characteristics of the image sensor. Specifically, the interference may increase the SNR of the image signal.

In the image sensor according to the second comparative example, each of the pixel units 110 may include a light receiver 10 and an output unit 20, like the first comparative example. At this time, the light receiver 10 may include a plurality of light receiving units 11, wherein each of the light receiving units 11 may include a photoelectric conversion element PD and a transfer transistor Tx. In the second comparative example, the light receiver 10 may include four light receiving units 11 which share one floating diffusion node FD. Thus, the image sensor according to the second comparative example may be referred to as a 4-shared-pixel-type image sensor.

In the image sensor according to the second comparative example, each of the pixel units 110 may have a structure in which a transfer gate and a reset gate may be arranged adjacent to each other, like the first comparative example. Thus, the operation characteristic of the image sensor may be degraded by the interference between the transfer and the reset gates. Furthermore, since the distances between the plurality of transfer gates and the reset gate are different from each other, a variation may occur in the extents of interference between the reset gate and the respective transfer gates. Thus, the characteristic degradation may further deepen.

As described above, the operation characteristic of the image sensor may be degraded because the gate of the transfer transistor Tx and the gate of the reset transistor Rx are arranged adjacent to each other in each of the pixel units 110. When the layout of the transfer and the reset gates is changed to increase the physical distance between the two gates, the above-described interference between the two gates may be prevented. However, changing the layout may be substantially impossible and not practical.

The following embodiments of the present invention provide an image sensor which is capable of preventing the characteristic degradation caused by the interference between the transfer and the reset gates in each of the pixel units 110, without changing the layout of the transfer and the reset gates. The image sensor may have a wiring structure which may electrically isolate (or insulate) the floating diffusion node FD from the reset transistor in each of the pixel units 110, and increase the electrical distance (i.e., insulation resistance) between the transfer and the reset gates in operation.

Figure 4A:
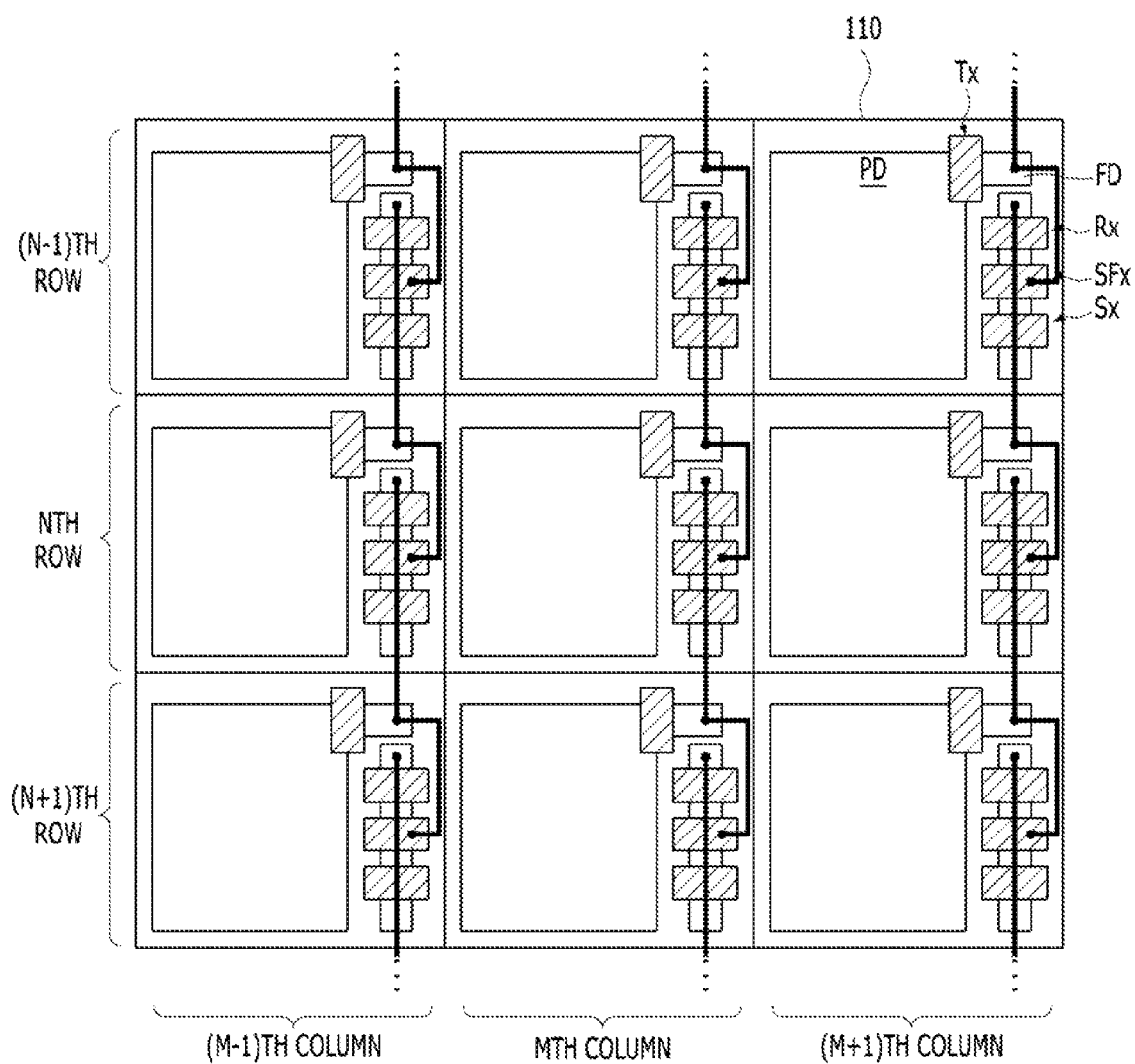
FIGS. 4A and 4B are diagrams illustrating a part of a pixel array of an image sensor according to a first embodiment of the present invention.
Figure 4B:
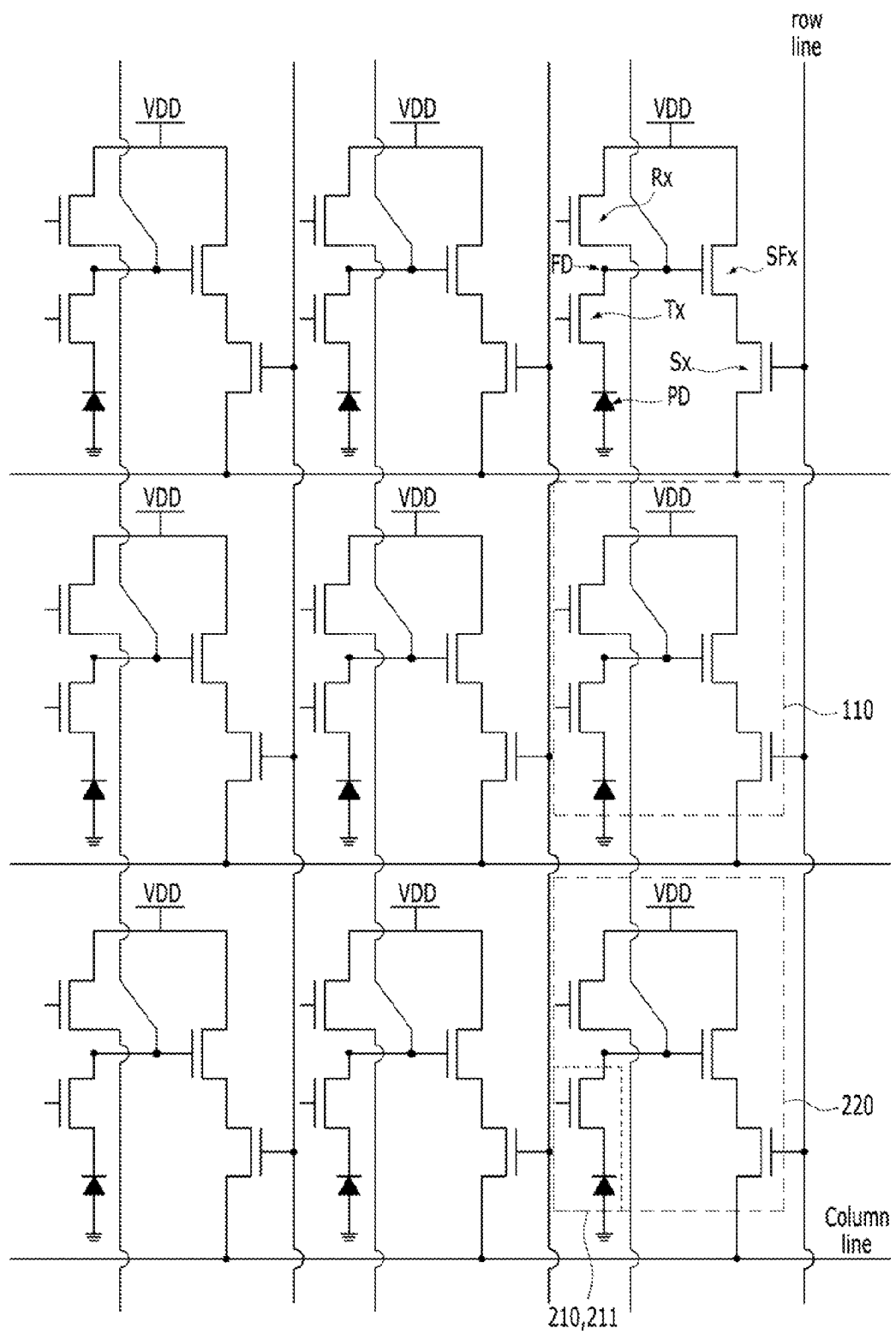
Figure 5A:
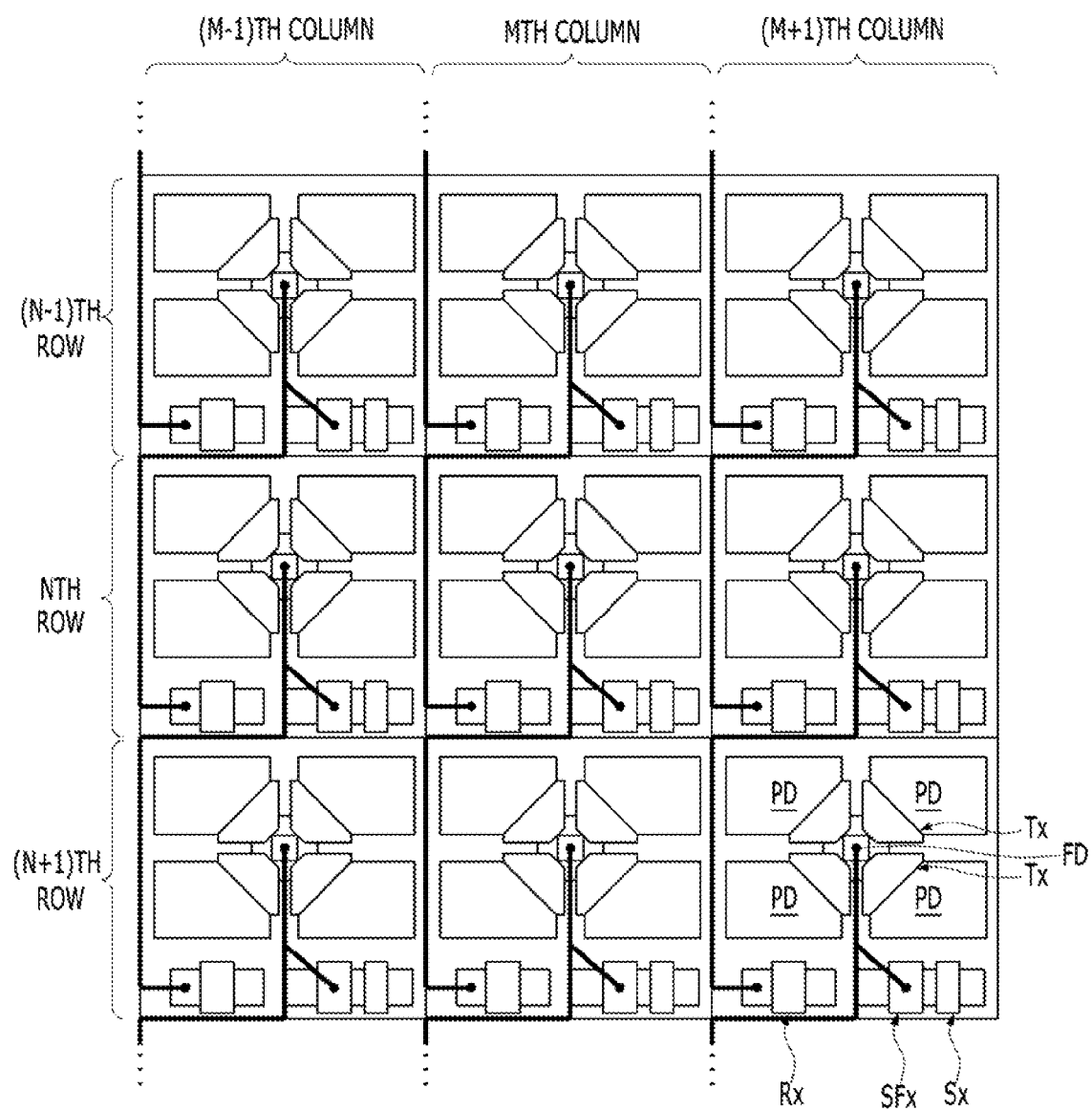
FIGS. 5A and 5B are diagrams illustrating a variation of the image sensor, according to the first embodiment of the present invention.
Figure 5B:
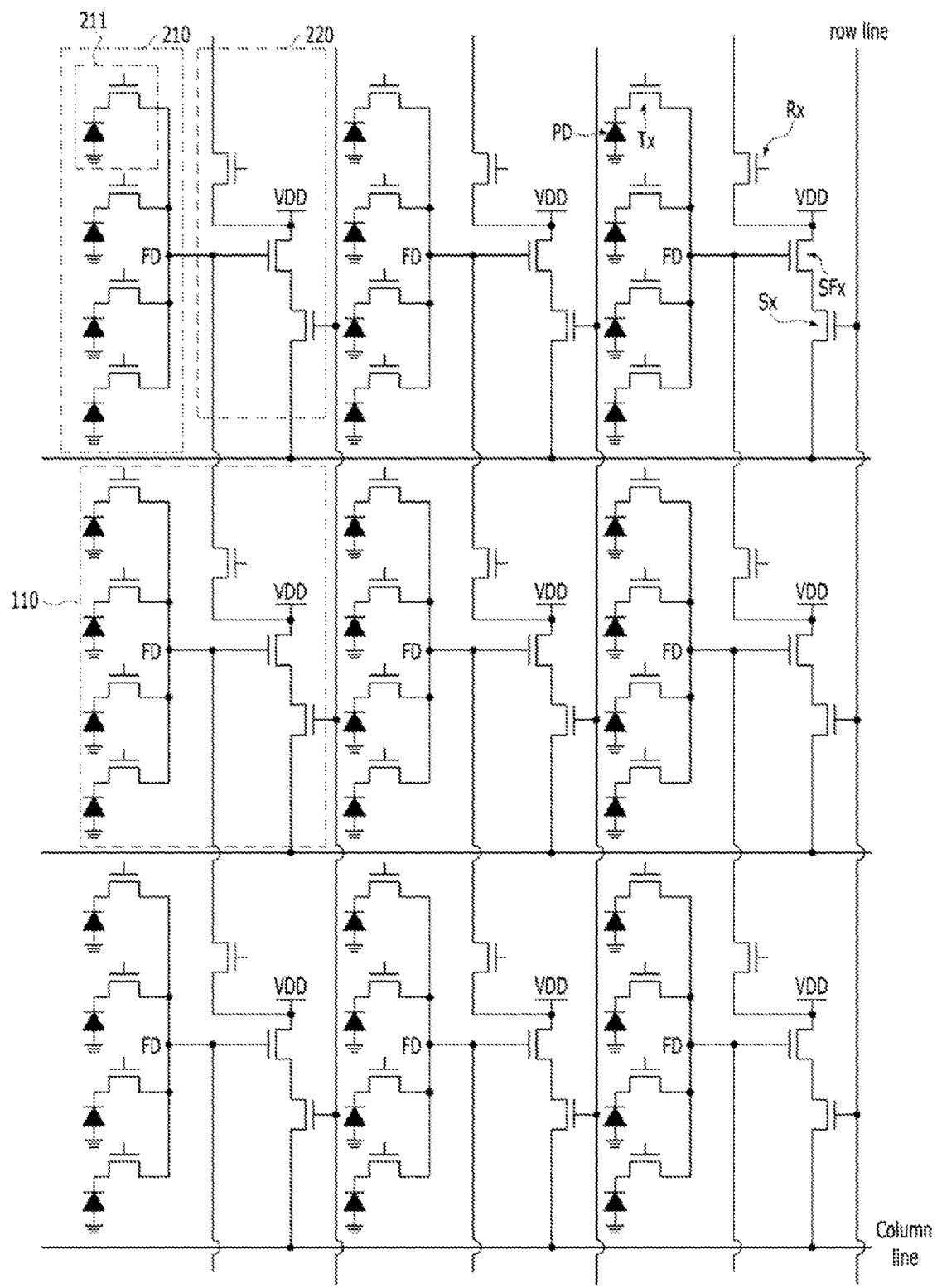

FIGS. 4A and 4B are diagrams illustrating a part of a pixel array of an image sensor according to a first embodiment of the present invention. FIGS. 5A and 5B are diagrams illustrating a variation of the image sensor according to the first embodiment of the present invention, that is, a 4-shared-pixel-type image sensor. FIGS. 4A and 5A are plan views, and FIGS. 4B and 5B are equivalent circuit diagrams. For reference, although not illustrated, row and column lines of the image sensor in FIGS. 4A and 5A may have similar shapes as those in FIGS. 2A and 3A.

As illustrated in FIGS. 4A, 4B, 5A, and 5B, an image sensor according to a first embodiment and a variation thereof may include a pixel array 100 (refer to FIG. 1) in which a plurality of pixel units 110 are arranged in a matrix shape. Each of the pixel units 110 may include a light receiver 210 and an output unit 220. The light receiver 210 may generate a photocharge in response to incident light, and the output unit 220 may output an image signal in response to the photocharge generated by the light receiver 210. An end of the light receiver 210 may be electrically coupled to a floating diffusion node FD.

In each of the pixel units 110, the light receiver 210 may include one or more light receiving units 211. The light receiving unit 211 may include a photoelectric conversion element PD and a transfer transistor Tx. The photoelectric conversion element PD may generate a photocharge in response to incident light. The transfer transistor Tx may couple the floating diffusion node FD and the photoelectric conversion element PD. The photoelectric conversion element PD may include a photodiode. The transfer transistor Tx may include a MOS transistor or thin film transistor. The transfer transistor Tx may transfer the photocharge generated by the photoelectric conversion element PD to the floating diffusion node FD in response to a transfer signal applied to a transfer gate thereof. FIGS. 4A and 4B illustrate the case in which the light receiver 210 may include one light receiving unit 211. FIGS. 5A and 5B illustrate the case in which the light receiver 210 may include a plurality of light receiving units 211 coupled in parallel to each other while sharing one floating diffusion node FD.

In each of the pixel units 110, the output unit 220 may include a reset transistor Rx which may be electrically isolated from the floating diffusion node FD in the pixel unit 110. The reset transistor Rx may reset a floating diffusion node FD in response to a reset signal applied to a reset gate thereof. One side of the reset transistor Rx may be electrically coupled to the floating diffusion node FD, while the other side of the reset transistor Rx may be coupled to a supply voltage node VDD. In the image sensor according to the first embodiment and the variation thereof, the floating diffusion node FD and the reset transistor Rx in each of the pixel units 110 may be electrically isolated from each other. Thus, in order to reset the floating diffusion node FD in one of the pixel units 110, the reset transistor Rx of another adjacent one of the pixel units 110 may be used. The coupling relation between the floating diffusion node FD and the reset transistor Rx in each of the pixel units 110 is described below.

Specifically, in each of the pixel units 110, the output unit 220 may include a source follower transistor SFx and a selection transistor Sx. The gate of the source follower transistor SFx may be coupled to the floating diffusion node FD, and both sides of the source follower transistor SFx may be coupled to the supply voltage node VDD and the selection transistor Sx, respectively. The source follower transistor SFx may generate an output voltage corresponding to a photocharge stored in the floating diffusion node FD. The photocharge represents an image signal. The gate of the selection transistor Sx may be coupled to a row line, and both sides of the selection transistor Sx may be coupled to the source follower transistor SFx and a column line, respectively. The selection transistor Sx may output the output voltage generated by the source follower transistor SFx to the column line in response to a selection signal applied through the row line.

In operation, for preventing interference between a transfer gate and a reset gate in each of the pixel units 110 without changing the layout thereof, the electrical distance between the two gates may be increased. The image sensor according to the first embodiment and the variation thereof may have a structure in which the floating diffusion node FD of one of the pixel units 110 may be electrically coupled to the reset transistor Rx of another pixel unit for example an adjacent pixel unit among the pixel units 110.

Specifically, the floating diffusion node FD of a pixel unit 110 may be coupled to the reset transistor Rx of another pixel unit 110 which may be arranged at the same column but at a different row compared to the subject pixel unit 110.

More specifically, for example, the floating diffusion node FD of the pixel unit 110 arranged at an Nth row and an Mth column in the pixel array 100 may be coupled to the reset transistor Rx of the pixel unit 110 arranged at the (N+1)th row and the Mth column, where N and M are natural numbers excluding zero. Furthermore, the floating diffusion node FD of the pixel unit 110 arranged at the Nth row and the Mth column in the pixel array 100 may be coupled to the reset transistor Rx of the pixel unit 110 arranged at the (N−1)th row and the Mth column.

As such, the floating diffusion node FD of the pixel unit 110 arranged at the Nth row and the Mth column may be electrically coupled to the reset transistor Rx of the pixel unit 110 arranged at the (N+1)th row and the Mth column or at the (N−1)th row and the Mth column. Thus, when a predetermined bias is applied to the transfer gate of the pixel unit 110 arranged at the Nth row and the Mth column during operation, the predetermined bias may not be applied to the reset gate of the same pixel unit 110. Therefore, interference or coupling between the transfer and the reset gates in each of the pixel units 110 may be prevented.

As described above, the floating diffusion node FD and the reset transistor Rx in each of the pixel units 110 may be electrically isolated from each other, and the floating diffusion node FD and the reset transistor Rx in different pixel units 110 may be electrically coupled to each other. Thus, in operation, the electrical distance between the transfer and the reset gates may be increased without changing the layout of the pixel transistors. Such architecture may prevent the characteristic degradation caused by interference between the transfer and the reset gates in each pixel during operation of an image sensor. Furthermore, such architecture may also prevent non-uniform interference caused by different distances between the plurality of transfer gates and the reset gate within each of the pixel units 110.

Figure 6A:
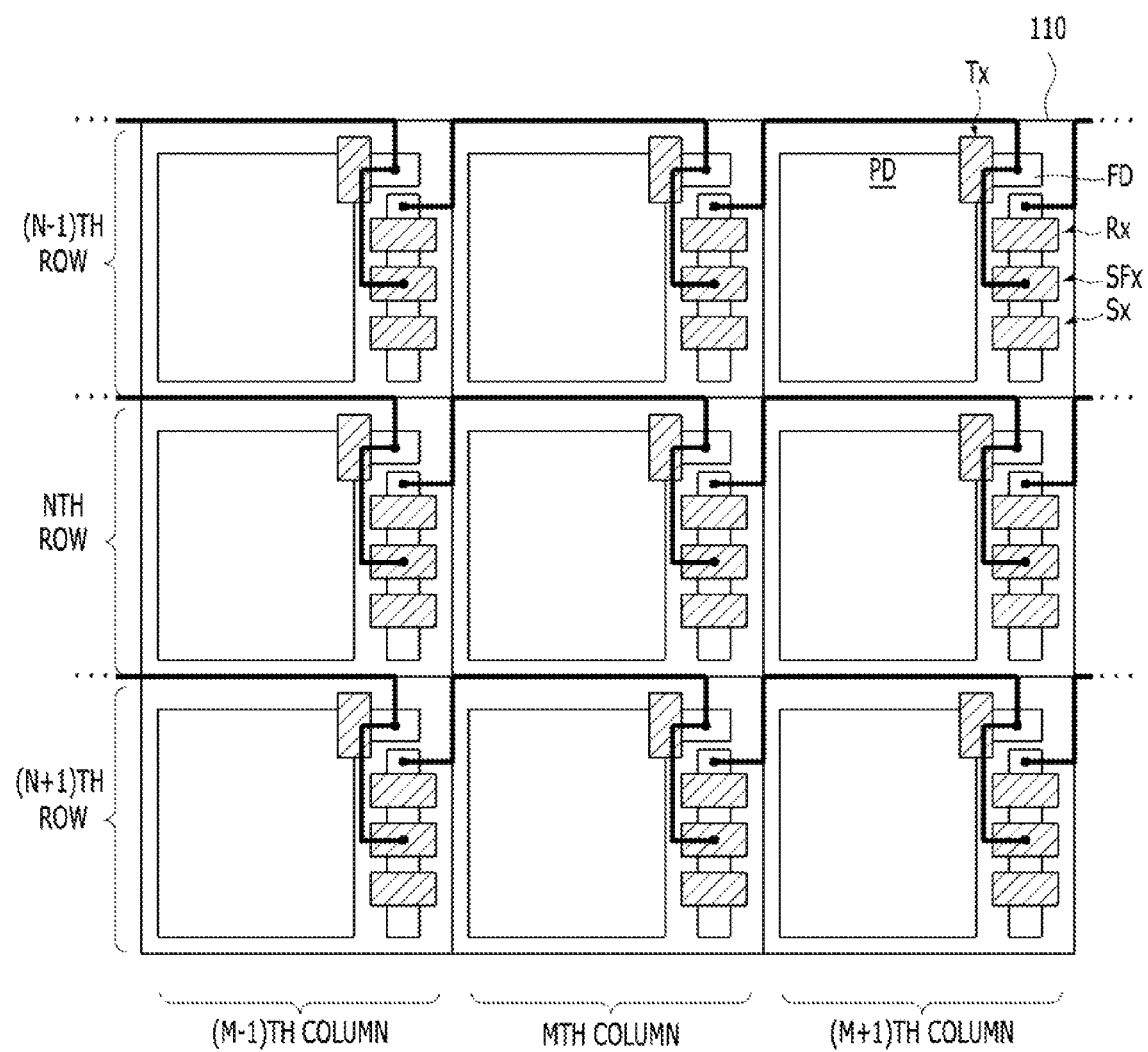
FIGS. 6A and 6B are diagrams illustrating a part of a pixel array of an image sensor, according to a second embodiment of the present invention.
Figure 6B:
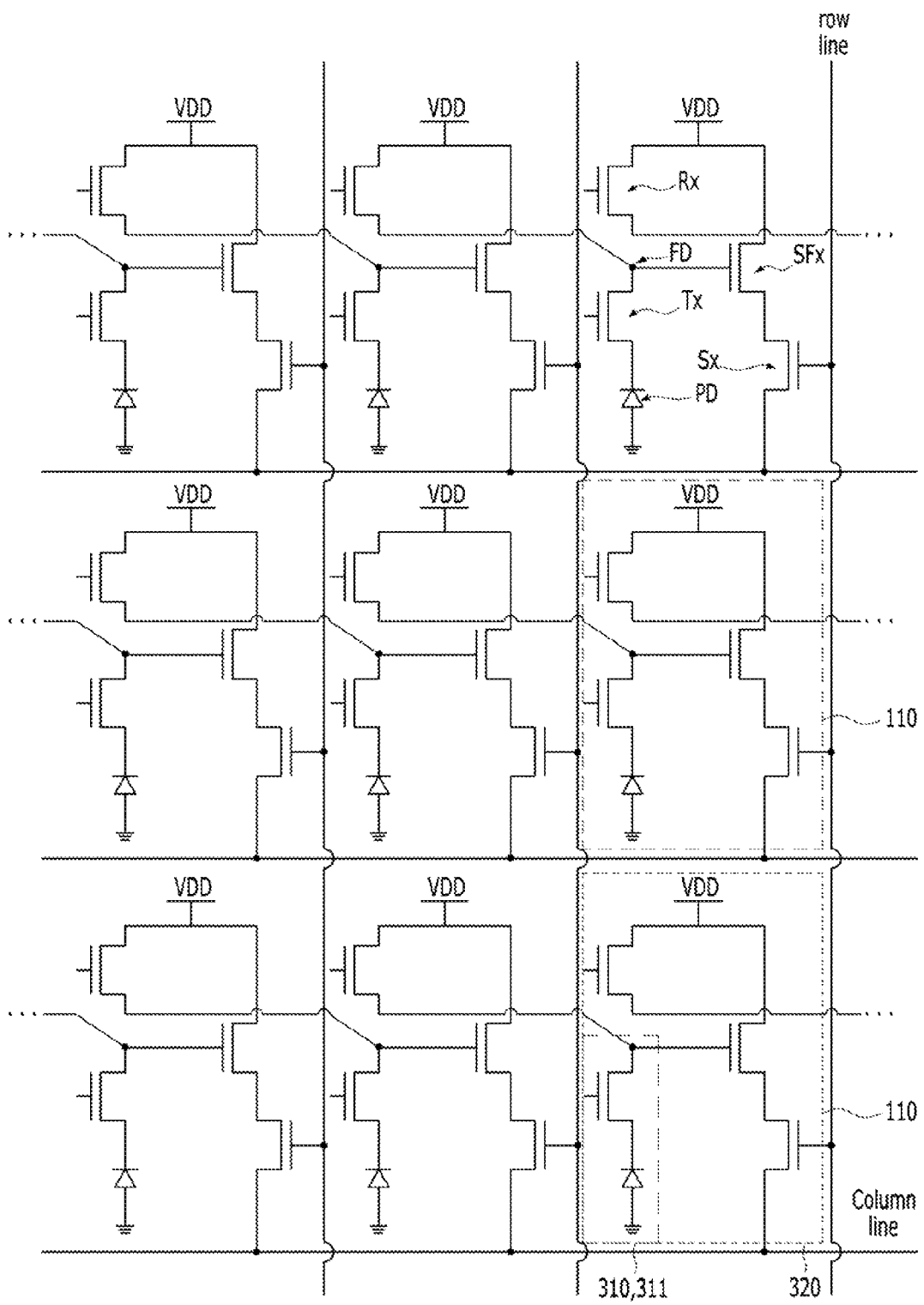
Figure 7A:
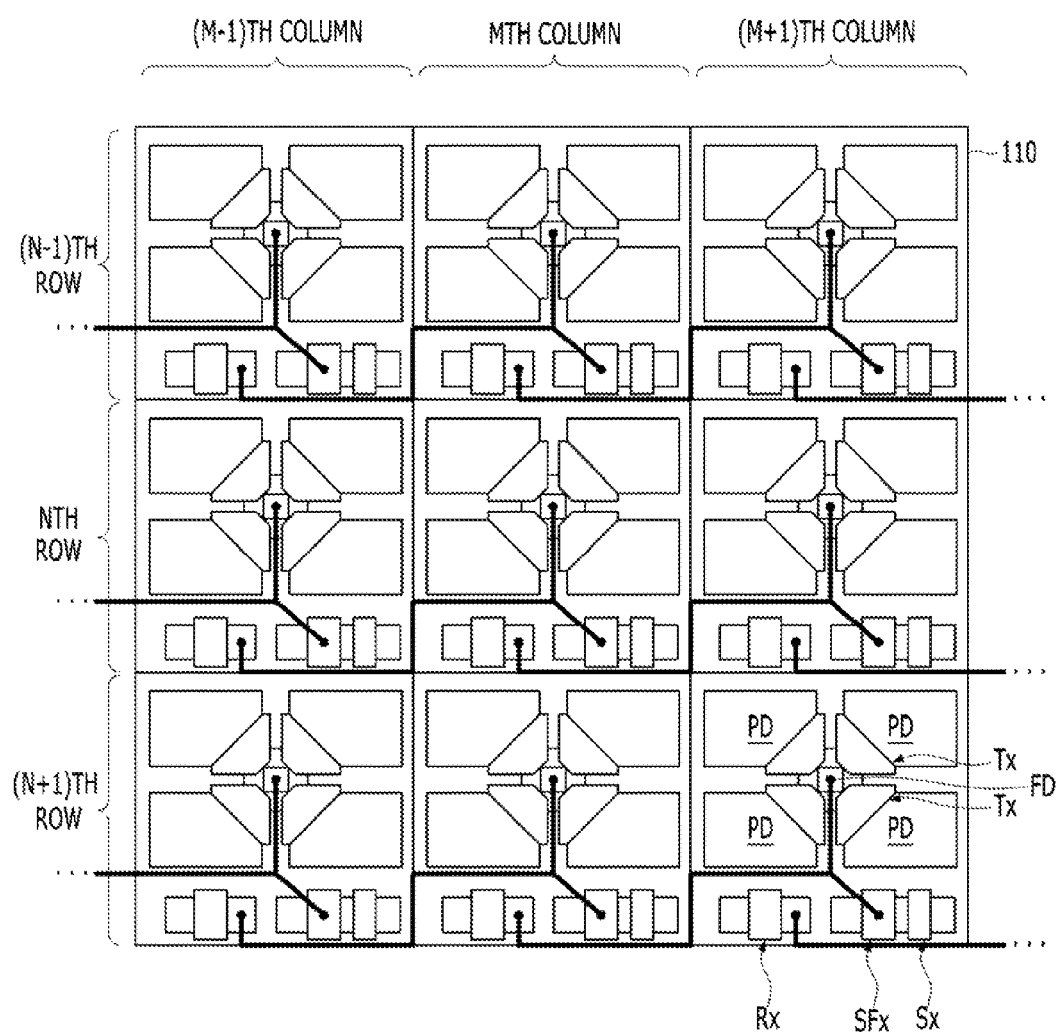
FIGS. 7A and 7B are diagrams illustrating a variation of the image sensor, according to the second embodiment of the present invention.
Figure 7B:
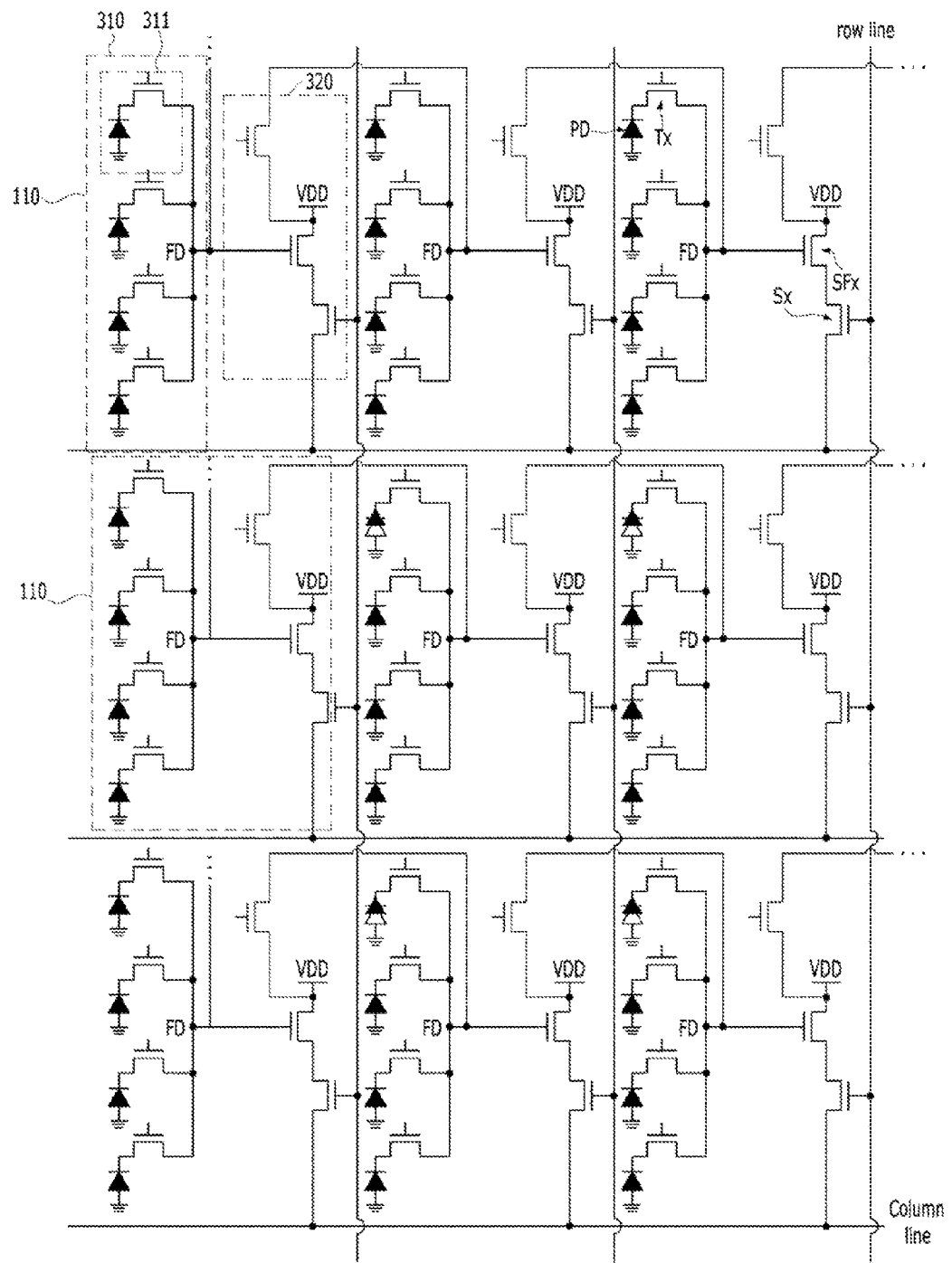

FIGS. 6A and 6B are diagrams illustrating a part of a pixel array of an image sensor according to a second embodiment of the present invention. FIGS. 7A and 7B are diagrams illustrating a variation of the image sensor according to the second embodiment of the present invention, that is, a 4-shared-pixel-type image sensor. FIGS. 6A and 7A are plan views, while FIGS. 6B and 7B are equivalent circuit diagrams. For reference, although not illustrated, row and column lines of the image sensor in FIGS. 6A and 7A may have similar shapes as those in FIGS. 2A and 3A.

As illustrated in FIGS. 6A, 6B, 7A, and 7B, an image sensor according to the second embodiment and a variation thereof may include a pixel array 100 (refer to FIG. 1) in which a plurality of pixel units 110 are arranged in a matrix structure. Each of the pixel units 110 may include a light receiver 310 and an output unit 320. The light receiver 310 may generate a photocharge in response to incident light, and the output unit 320 may output an image signal in response to the photocharge generated by the light receiver 310. An end of the light receiver 310 may be electrically coupled to a floating diffusion node FD.

In each of the pixel units 110, the light receiver 310 may include one or more light receiving units 311. The light receiving unit 311 may include a photoelectric conversion element PD and a transfer transistor Tx. The photoelectric conversion element PD may generate a photocharge in response to incident light. The transfer transistor Tx may couple the floating diffusion node FD and the photoelectric conversion element PD. The photoelectric conversion element PD may include a photodiode. The transfer transistor Tx may include a MOS transistor or a thin film transistor. The transfer transistor Tx may transfer the photocharge generated by the photoelectric conversion element PD to the floating diffusion node FD in response to a transfer signal applied to a transfer gate thereof. FIGS. 6A and 6B illustrate the case in which the light receiver 310 includes one light receiving unit 311. FIGS. 7A and 7B illustrate the case in which the light receiver 310 includes a plurality of light receiving units 311 coupled in parallel to each other while sharing one floating diffusion node FD.

In each of the pixel units 110, the output unit 320 may include a reset transistor Rx which is electrically isolated from the floating diffusion node FD in the pixel unit 110. The reset transistor Rx may reset a floating diffusion node FD in response to a reset signal applied to a reset gate thereof. One side of the reset transistor Rx may be electrically coupled to the floating diffusion node FD, while the other side of the reset transistor Rx may be coupled to a supply voltage node VDD. In the image sensor according to the second embodiment and the variation thereof, the floating diffusion node FD and the reset transistor Rx in each of the pixel units 110 may be electrically isolated from each other. Thus, in order to reset the floating diffusion node FD in one of the pixel units 110, the reset transistor Rx of another adjacent one of the pixel units 110 may be used. The coupling relation between the floating diffusion node FD and the reset transistor Rx in each of the pixel units 110 is described below.

In each of the pixel units 110, the output unit 320 may include a source follower transistor SFx and a selection transistor Sx. The gate of the source follower transistor SFx may be coupled to the floating diffusion node FD. Both sides of the source follower transistor SFx may be coupled to the supply voltage node VDD and the selection transistor Sx, respectively. The source follower transistor SFx may generate an output voltage corresponding to a photocharge stored in the floating diffusion node FD, that is, an image signal. The gate of the selection transistor Sx may be coupled to a row line. Both sides of the selection transistor Sx may be coupled to the source follower transistor SFx and a column line, respectively. The selection transistor Sx may output the output voltage generated by the source follower transistor SFx to the column line in response to a selection signal applied through the row line.

In operation, for preventing interference between the transfer and the reset gates, in each of the pixel units 110, the electrical distance between the two gates may be increased. The image sensor according to the second embodiment and the variation thereof may have a structure in which the floating diffusion node FD of one of the pixel units 110 may be electrically coupled to the reset transistor Rx of another adjacent one of the pixel units 110.

Specifically, the floating diffusion node FD of any one pixel unit 110 among the plurality of pixel units 110 in the pixel array 100 may be coupled to the reset transistor Rx of another pixel unit 110 which is arranged at the same row but a different column compared to the one pixel unit 110.

More specifically, the floating diffusion node FD of the pixel unit 110 arranged at an Nth row and an Mth column in the pixel array 100 may be coupled to the reset transistor Rx of the pixel unit 110 arranged at the Nth row and the (M+1)th column, where N and M are natural numbers excluding zero. Furthermore, the floating diffusion node FD of the pixel unit 110 arranged at the Nth row ad the Mth column in the pixel array 100 may be coupled to the reset transistor Rx of the pixel unit 110 arranged at the Nth row and the (M−1)th column.

As the floating diffusion node FD of the pixel unit 110 arranged at the Nth row and the Mth column is electrically coupled to the reset transistor Rx of the pixel unit 110 arranged at the Nth row and the (M+1)th column or at the Nth row and the (M−1)th column, a known operation method may be applied as it is. At this time, although the known operation method is applied as it is, the pixel unit 110 arranged at the Nth row and the Mth column may be enabled at different time from the pixel units 110 arranged at the Nth row and the (M+1)th column and at the Nth row and the (M−1)th column. Thus, interference or coupling between the transfer and the reset gates in each of the pixel units 110 may be prevented.

As described above, the floating diffusion node FD and the reset transistor Rx in each of the pixel units 110 may be electrically isolated from each other, and the floating diffusion node FD and the reset transistor Rx in different pixel units 110 may be electrically coupled to each other. Thus, in operation, the electrical distance between the transfer and the reset gates may be increased without changing the layout of the pixel transistors. Such architecture of the pixel transistors may prevent the characteristic degradation caused by interference between the transfer and the reset gates in operation. Furthermore, such architecture may also prevent non-uniform interference caused by different distances between the plurality of transfer gates and the reset gate within each of the pixel units 110.

Figure 8A:
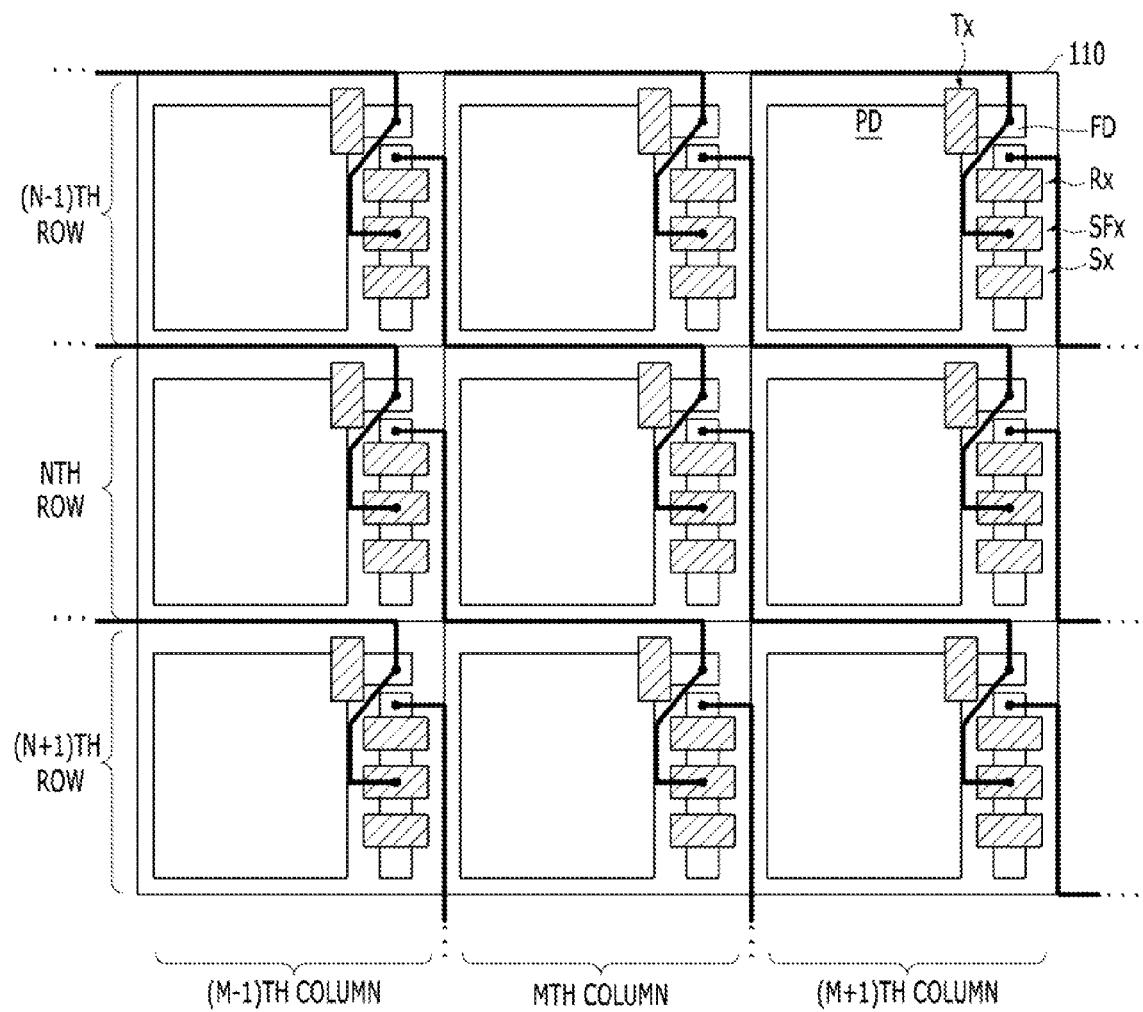
FIGS. 8A and 8B are diagrams illustrating a part of a pixel array of an image sensor, according to a third embodiment of the present invention.
Figure 8B:
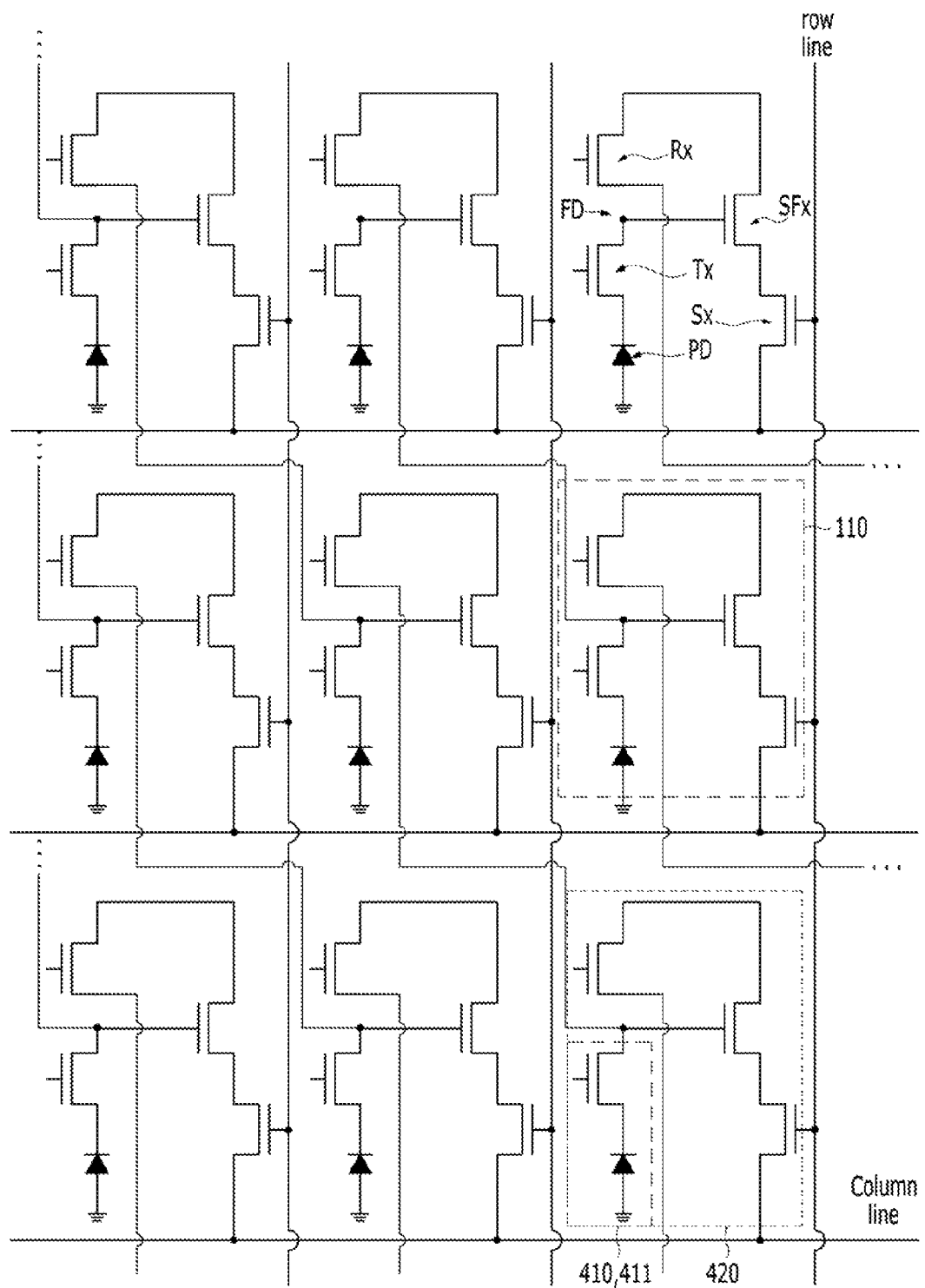
Figure 9A:
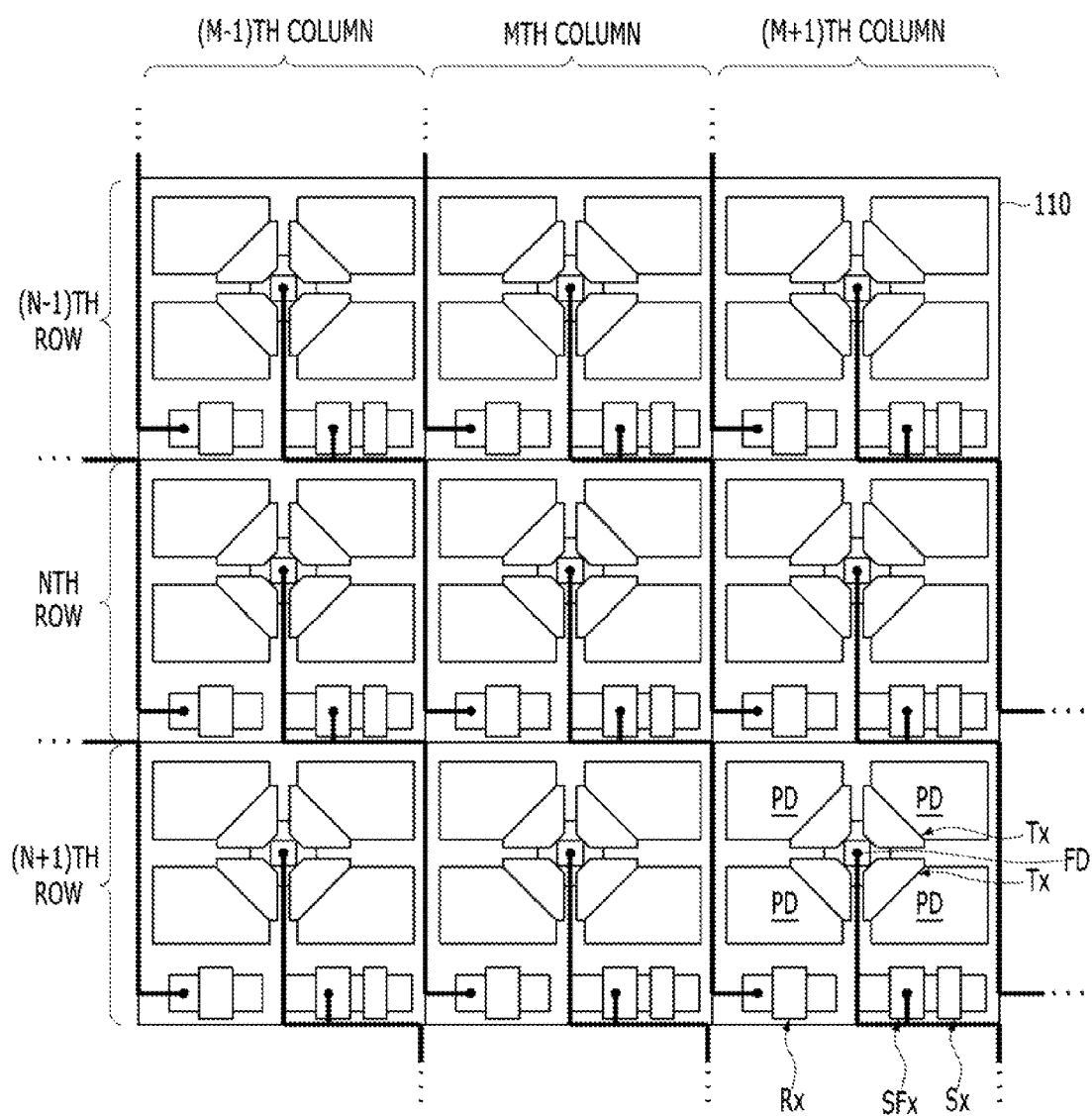
FIGS. 9A and 9B are diagrams illustrating a variation of the image sensor according, to the third embodiment of the present invention.
Figure 9B:
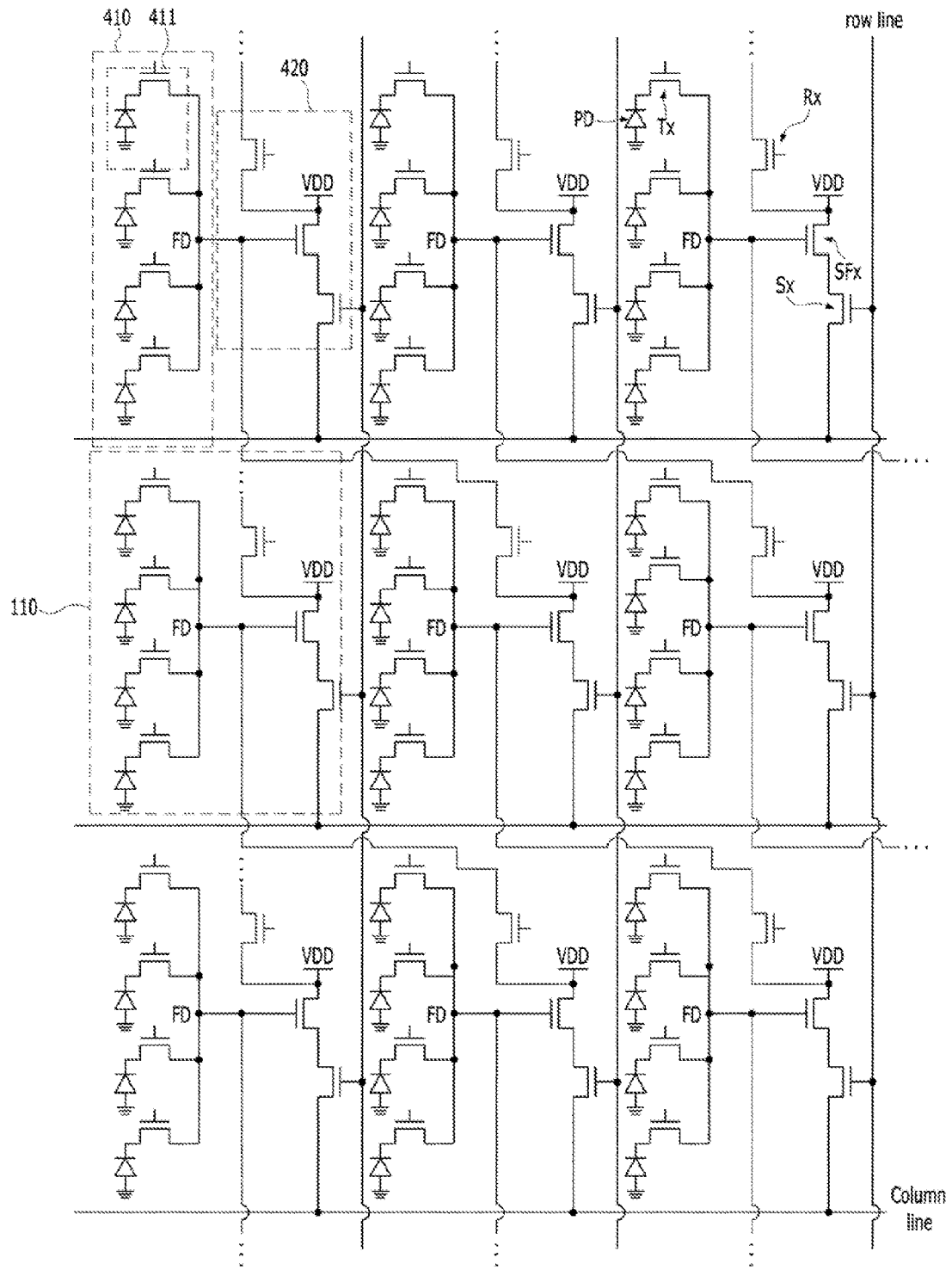

FIGS. 8A and 8B are diagrams illustrating a part of a pixel array of an image sensor according to a third embodiment of the present invention. FIGS. 9A and 9B are diagrams illustrating a variation of the image sensor according to the third embodiment of the present invention, that is, a 4-shared-pixel-type image sensor. FIGS. 8A and 9A are plan views, and FIGS. 8B and 9B are equivalent circuit diagrams. For reference, although not illustrated, row and column lines of the image sensor in FIGS. 8A and 9A may have the similar shapes as those in FIGS. 2A and 3A.

As illustrated in FIGS. 8A, 8B, 9A, and 9B, the image sensor according to the third embodiment and the variation thereof may include a pixel array 100 (refer to FIG. 1) in which a plurality of pixel units 110 are arranged in a matrix shape. Each of the pixel units 110 may include a light receiver 410 and an output unit 420. The light receiver 410 may generate a photocharge in response to incident light, and the output unit 420 may output an image signal in response to the photocharge generated by the light receiver 410. An end of the light receiver 410 may be electrically coupled to a floating diffusion node FD.

In each of the pixel units 110, the light receiver 410 may include one or more light receiving units 411. The light receiving unit 411 may include a photoelectric conversion element PD and a transfer transistor Tx. The photoelectric conversion element PD may generate a photocharge in response to incident light, and the transfer transistor Tx may couple the floating diffusion node FD and the photoelectric conversion element PD. The photoelectric conversion element PD may include a photodiode. The transfer transistor Tx may include a MOS transistor or thin film transistor. The transfer transistor Tx may serve to transfer the photocharge generated by the photoelectric conversion element PD to the floating diffusion node FD in response to a transfer signal applied to a transfer gate thereof. FIGS. 8A and 8B illustrate the case in which the light receiver 410 includes one light receiving unit 411. FIGS. 9A and 9B illustrate the case in which the light receiver 410 includes a plurality of light receiving units 411 coupled in parallel to each other while sharing one floating diffusion node FD.

In each of the pixel units 110, the output unit 420 may include a reset transistor Rx electrically isolated from the floating diffusion node FD in the pixel unit 110. The reset transistor Rx may reset a floating diffusion node FD in response to a reset signal applied to a reset gate thereof. One side of the reset transistor Rx may be electrically coupled to the floating diffusion node FD, and the other side of the reset transistor Rx may be coupled to a supply voltage node VDD. In the image sensor according to the third embodiment and the variation thereof, the floating diffusion node FD and the reset transistor Rx in each of the pixel units 110 may be electrically isolated from each other. Thus, in order to reset the floating diffusion node FD in one of the pixel units 110, the reset transistor Rx of another adjacent one of the pixel units 110 is to be used. The coupling relation between the floating diffusion node FD and the reset transistor Rx in each of the pixel units 110 will be described below.

In each of the pixel units 110, the output unit 220 may include a source follower transistor SFx and a selection transistor Sx. The gate of the source follower transistor SFx may be coupled to the floating diffusion node FD, and both sides of the source follower transistor SFx may be coupled to the supply voltage node VDD and the selection transistor Sx, respectively. The source follower transistor SFx may generate an output voltage corresponding to photocharge stored in the floating diffusion node FD, that is, an image signal. The gate of the selection transistor Sx may be coupled to a row line, and both sides of the selection transistor Sx may be coupled to the source follower transistor SFx and a column line, respectively. The selection transistor Sx may output the voltage generated by the source follower transistor SFx to the column line in response to a selection signal applied through the row line.

In operation, for preventing interference between the transfer and the reset gates in each of the pixel units 110, without changing the layout thereof, the electrical distance between the two gates may be increased. The image sensor according to the third embodiment and the variation thereof may have a structure in which the floating diffusion node FD of one of the pixel units 110 is electrically coupled to the reset transistor Rx of another adjacent one of the pixel unit 110.

Specifically, the floating diffusion node FD of any one pixel unit 110 among the plurality of pixel units 110 in the pixel array 100 may be coupled to the reset transistor Rx of another pixel unit 110 which is arranged at a different row and column from the one pixel unit 110. That is, the floating diffusion node FD of one pixel unit 110 may be coupled to the reset transistor Rx of another pixel unit 110 arranged adjacent in a diagonal direction based on the one pixel unit 110.

More specifically, the floating diffusion node FD of the pixel unit 110 arranged at an Nth row and an Mth column in the pixel array 100 may be coupled to any one of the reset transistors Rx of the pixel units 110 arranged at the (N+1)th row and the (M−1)th column, at the (N+1)th row and the (M+1)th column, at the (N−1)th row and the (M−1)th column, and at the (N−1)th row and the (M+1)th column, where N and M are natural numbers excluding zero.

As such, the floating diffusion node FD of the pixel unit 110 arranged at the Nth row and the Mth column may be electrically coupled to the reset transistor Rx of another pixel unit 110 arranged adjacent in a diagonal direction to the pixel unit 110. Thus, when a predetermined bias is applied to the transfer gate of the pixel unit 110 arranged at the Nth row and the Mth column during operation, the predetermined bias may not be applied to the reset gate of the same pixel unit 110. Therefore, interference or coupling between the transfer and the reset gates in each of the pixel units 110 may be prevented.

As described above, the floating diffusion node FD and the reset transistor Rx in each of the pixel units 110 may be electrically isolated from each other, and the floating diffusion node FD and the reset transistor Rx in different pixel units 110 may be electrically coupled to each other. Thus, in operation, the electrical distance between the transfer and the reset gates may be increased without changing the layout of the pixel transistors. Such architecture may prevent the characteristic degradation caused by interference between the transfer and the reset gates in operation of an image sensor. Furthermore, such architecture may also prevent non-uniform interference caused by different distances between the plurality of transfer gates and the reset gate within each of the pixel units 110.

The aforementioned image sensor according to the embodiment may be applied to various electronic devices. Hereinafter, with reference to FIG. 10, an example of an electronic device including the image sensor according to an embodiment of the invention is described. Specifically, the electronic device of FIG. 10 may be of a digital still camera capable of capturing a still image.

Figure 10:
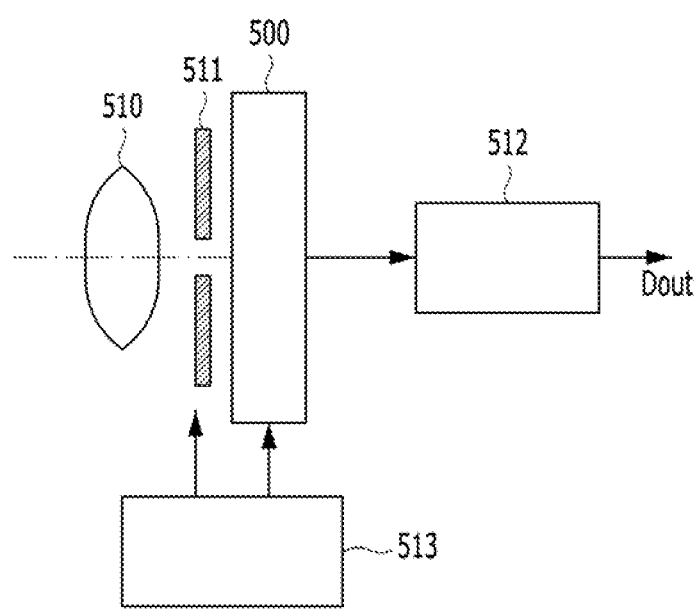
FIG. 10 is a diagram illustrating an electronic device, according to an embodiment of the present invention.

As illustrated in FIG. 10, the electronic device may include an optical lens 510, a shutter 511, an image sensor 500, a driving circuit 513, and a signal processing circuit 512. The image sensor 511 may have the same configuration as the image sensor shown in FIGS. 4A to 9B.

The optical lens 510 may form an image of incident light from an object on an imaging surface of the image sensor 500. Thus, a charge corresponding to a signal is accumulated in the image sensor 500 for a predetermined period. The driving circuit 513 supplies a transmission operation signal to the image sensor 500. The signal transmission of the image sensor 500 may be performed by a driving signal (or a timing signal) supplied from the driving circuit 513. The signal processing circuit 512 may perform various types of signal processing. An image signal subjected to the signal processing may be stored in a storage medium such as a memory or may be outputted to a monitor.

According to the embodiments of the present invention, the image sensor may prevent the characteristic degradation caused by the interference between pixel transistors in each of the pixel units.

Although various embodiments have been described for illustrative purposes, it will be apparent to those skilled in the art that various changes and variations may be made without departing from the spirit and scope of the invention as defined in the following claims.

What is claimed is:

1. An image sensor comprising a pixel array comprising a plurality of pixel units arranged in a matrix structure, wherein each of the pixel units comprising:
   a light receiver suitable for generating a photocharge in response to incident light;
   a floating diffusion node electrically coupled to an end of the light receiver; and
   a reset transistor electrically isolated from the floating diffusion node;
   wherein the floating diffusion node of a first pixel unit among the plurality of pixel units is electrically coupled to a reset transistor of a second pixel unit among the plurality of pixel units.

2. The image sensor of claim 1, wherein the second pixel unit is adjacent to the first pixel unit.

3. The image sensor of claim 1, wherein the first pixel unit is arranged at the same column but a different row as/from the second pixel unit.

4. The image sensor of claim 1, wherein when the first pixel unit is arranged at an Nth row and an Mth column in the pixel array, the second pixel unit is arranged at an (N+1)th row and the Mth column or at an (N−1)th row and the Mth column, where N and M are natural numbers excluding zero.

5. The image sensor of claim 1, wherein the first pixel unit is arranged at the same row but a different column as/from the second pixel unit.

6. The image sensor of claim 1, wherein when the first pixel unit is arranged at an Nth row and an Mth column in the pixel array, the second pixel unit is arranged at the Nth row and an (M+1)th column or at the Nth row and an (M−1)th column, where N and M are natural numbers excluding zero.

7. The image sensor of claim 1, wherein the first pixel unit is arranged at a different row and a different column from the second pixel unit.

8. The image sensor of claim 1, wherein the first pixel unit is arranged in a diagonal direction based on the second pixel unit.

9. The image sensor of claim 1, wherein when the first pixel unit is arranged at an Nth row and an Mth column in the pixel array, the second pixel unit is arranged at one of (N−1)th and (N+1)th rows and one of (M−1)th and (M+1)th columns, where N and M are natural numbers excluding zero.

10. The image sensor of claim 1, wherein the light receiver comprises one or more light receiving unit each light receiving unit comprising:
    a photoelectric conversion element suitable for generating the photocharge in response to the incident light; and
    a transfer transistor suitable for coupling the photoelectric conversion element and the floating diffusion node.

11. An image sensor comprising a pixel array comprising a plurality of pixel units arranged in a matrix structure, wherein each of the pixel units comprising:
    a light receiver suitable for generating a photocharge in response to incident light;
    a floating diffusion node electrically coupled to an end of the light receiver;
    a reset transistor electrically isolated from the floating diffusion node; and
    a source follower transistor having a gate electrically coupled to the floating diffusion node.

12. The image sensor of claim 11, wherein a floating diffusion node of a first pixel unit is electrically coupled to a reset transistor of a second pixel unit.

13. The image sensor of claim 12, wherein the second pixel unit is adjacent to the first pixel unit.

14. The image sensor of claim 12, wherein the first pixel unit is arranged at the same column but at a different row as/from the second pixel unit.

15. The image sensor of claim 12, wherein the first pixel unit is arranged at the same row but at a different column as/from the second pixel unit.

16. The image sensor of claim 12, wherein the first pixel unit is arranged at a different row and at a different column from the second pixel unit.

17. The image sensor of claim 12, wherein the first pixel unit is arranged in a diagonal direction based on the second pixel unit.

18. The image sensor of claim 11, wherein when the first pixel unit is arranged at an Nth row and an Mth column in the pixel array, the second pixel unit is arranged at an (N+1)th row and the Mth column or at an (N−1)th row and the Mth column, where N and M are natural numbers excluding zero.

19. The image sensor of claim 11, wherein when the first pixel unit is arranged at an Nth row and an Mth column in the pixel array, the second pixel unit is arranged at the Nth row and an (M+1)th column or at the Nth row and an (M−1)th column, where N and M are natural numbers excluding zero.

20. The image sensor of claim 11, wherein when the first pixel unit is arranged at an Nth row and an Mth column in the pixel array, the second pixel unit is arranged at one of (N−1)th and (N+1)th rows and one of (M−1)th and (M+1)th columns, where N and M are natural numbers excluding zero.

21. An image sensor comprising a pixel array comprising plurality of pixel units arranged in a matrix structure, wherein each of the pixel units comprising:
    a light receiver suitable for generating a photocharge in response to an incident light; and
    an output unit electrically coupled to the light receiver through a floating diffusion node, suitable for outputting an image signal response to the photocharge, and comprising:
        a reset transistor electrically isolated from the floating diffusion node of the pixel unit and suitable for resetting a floating diffusion node of an adjacent pixel unit among the plurality of pixel units,
    wherein the floating diffusion node of the pixel unit is reset by an adjacent pixel unit among the plurality of pixel units.

* * * * *